(12) United States Patent
Kondo

(10) Patent No.: US 11,590,754 B2
(45) Date of Patent: Feb. 28, 2023

(54) IMPRINT APPARATUS AND ARTICLE MANUFACTURING METHOD

(71) Applicant: CANON KABUSHIKI KAISHA, Tokyo (JP)

(72) Inventor: Yousuke Kondo, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 17/229,973

(22) Filed: Apr. 14, 2021

(65) Prior Publication Data

US 2021/0339526 A1  Nov. 4, 2021

(30) Foreign Application Priority Data

Apr. 30, 2020  (JP) .............................. JP2020-080690

(51) Int. Cl.
*B41J 2/045* (2006.01)
*G03F 7/00* (2006.01)
*B41J 2/14* (2006.01)

(52) U.S. Cl.
CPC ......... *B41J 2/04581* (2013.01); *B41J 2/0459* (2013.01); *B41J 2/14201* (2013.01); *G03F 7/0002* (2013.01)

(58) Field of Classification Search
CPC .................................................. B41J 2/04581
See application file for complete search history.

(56) References Cited

U.S. PATENT DOCUMENTS

| | | | |
|---|---|---|---|
| 2002/0036666 A1* | 3/2002 | Taki | B41J 2/04541 347/11 |
| 2010/0233377 A1* | 9/2010 | Aoki | B29C 59/022 427/355 |
| 2017/0043578 A1* | 2/2017 | Goh | B41J 2/04573 |
| 2018/0321604 A1* | 11/2018 | Namba | G03F 9/7042 |
| 2020/0290346 A1 | 9/2020 | Katsuta | |

FOREIGN PATENT DOCUMENTS

JP        2019107826 A    7/2019
WO   WO-2017086374 A1 *  5/2017  .......... B41J 2/04505

* cited by examiner

*Primary Examiner* — Shelby L Fidler
(74) *Attorney, Agent, or Firm* — Rossi, Kimms & McDowell LLP

(57) ABSTRACT

An imprint apparatus includes a controller for controlling an imprint process and a supply device for supplying an imprint material. The supply device includes discharge devices to discharge an imprint material, and a discharge controller to control the discharge devices under the control of the controller. The discharge controller includes a buffer memory to temporarily store driving waveform data. Each of the discharge devices includes a discharge element and a driver for driving the discharge element based on the driving waveform data stored in the buffer memory. While a supply step of supplying an imprint material for a first shot region is performed, the controller transfers the driving waveform data for the supply step of a second shot region to a storage area of the buffer memory which is not used in the supply step of the first shot region.

8 Claims, 15 Drawing Sheets

FIG. 1A
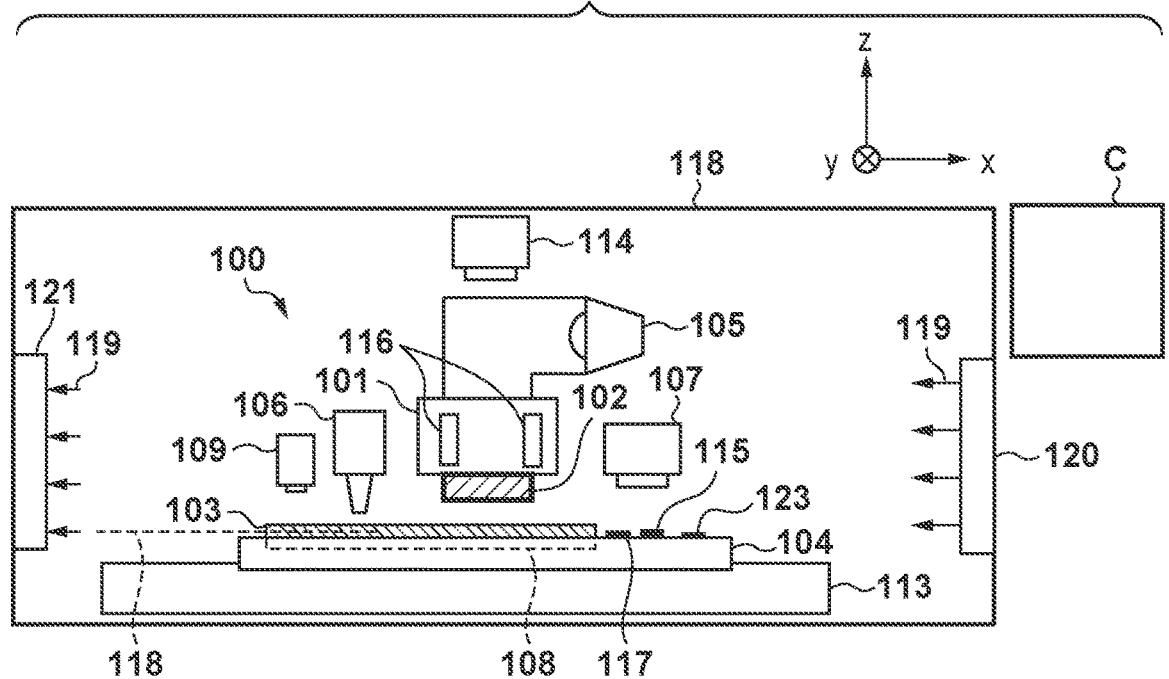
FIG. 1B
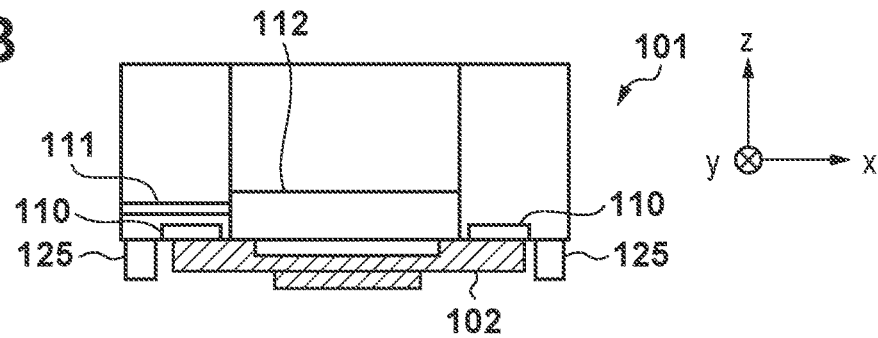
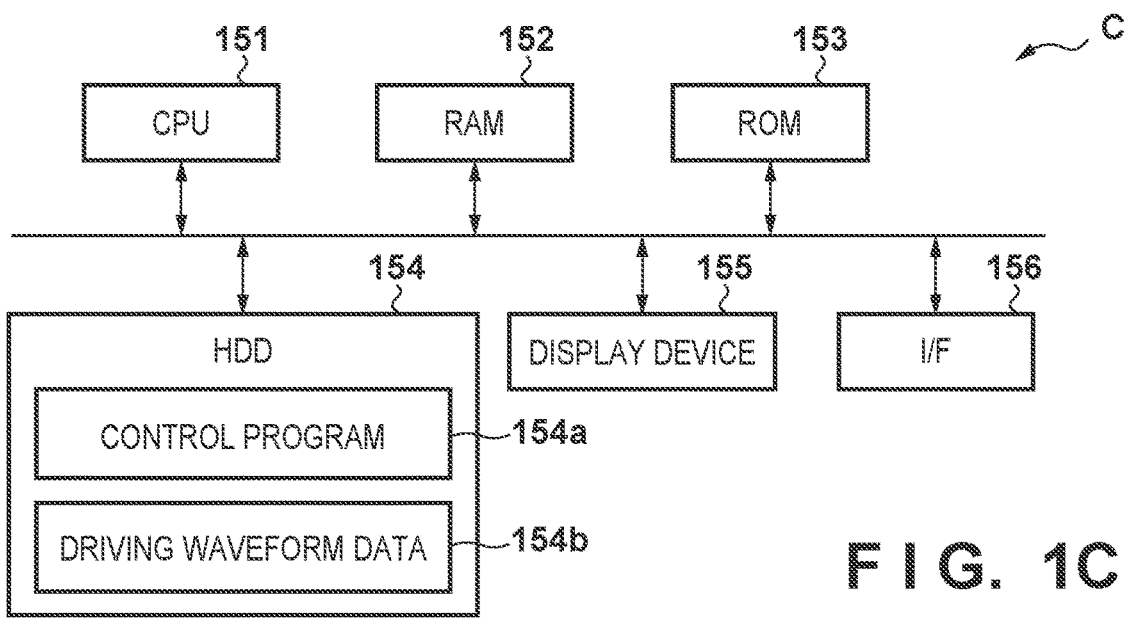
FIG. 1C

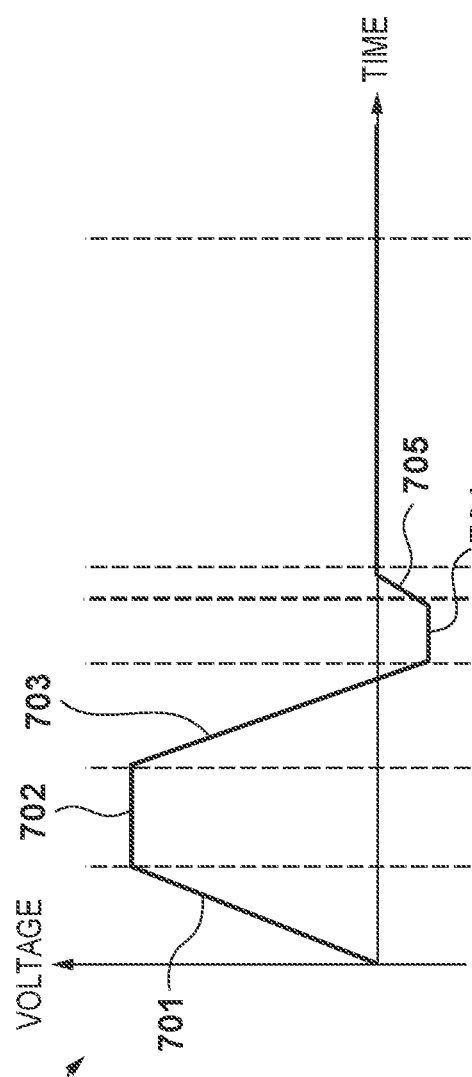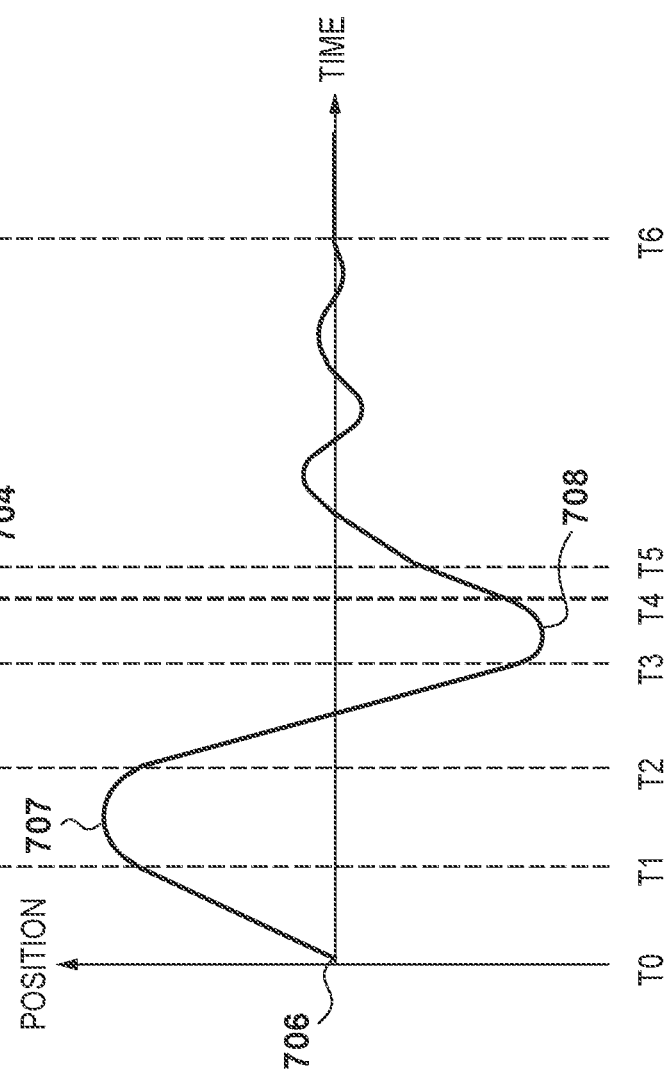

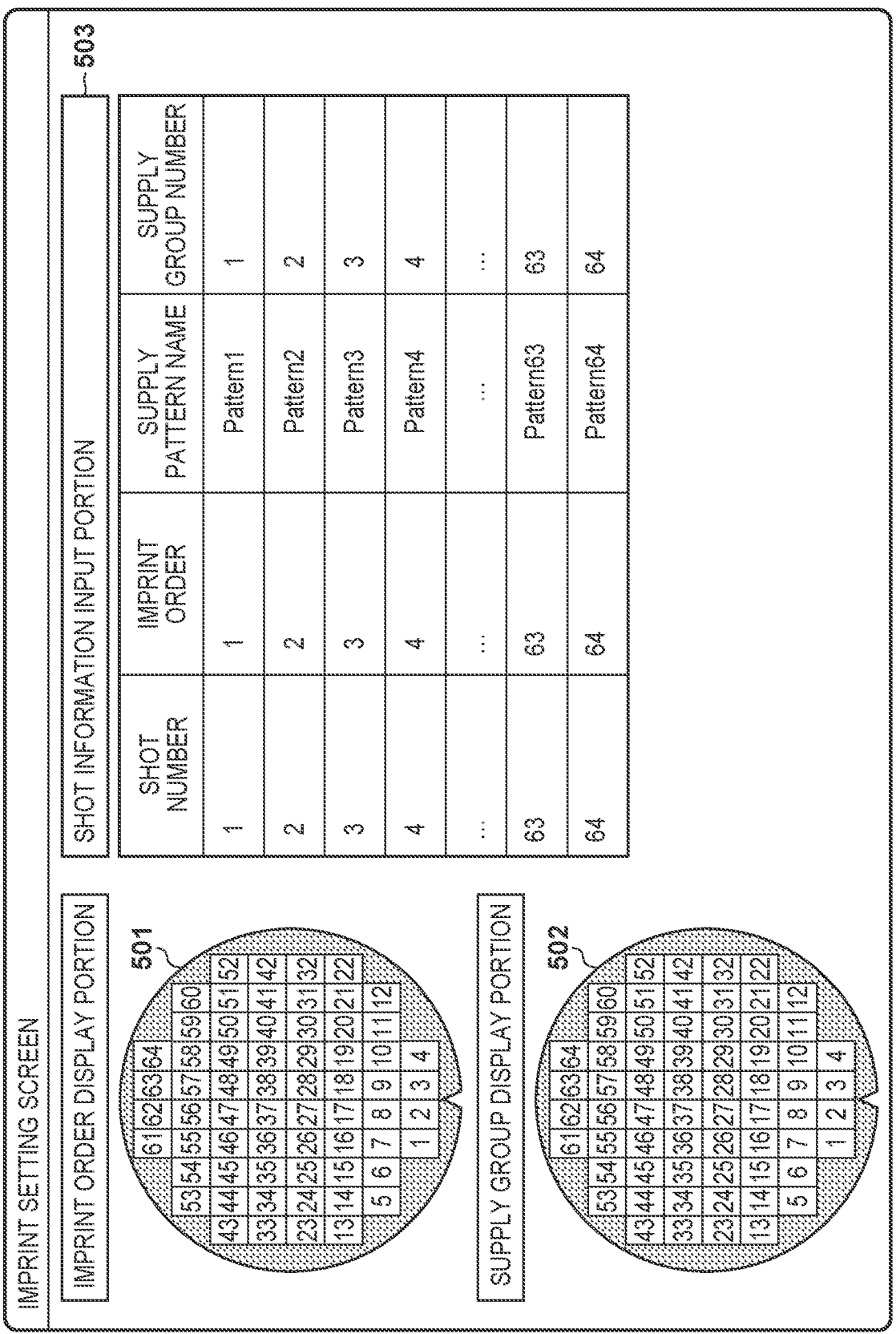

FIG. 6A

| SCAN DIRECTION | NOZZLE NUMBER | SUPPLY CONDITION NUMBER |
|---|---|---|
| 1 | 1 | 1,2,3,0,1,2,... |
| 1 | 2 | 1,1,1,1,1,1,... |
| 1 | 3 | 0,0,0,0,0,0,... |
| ... | ... | |
| 2 | 1 | 0,0,0,0,0,0,... |
| 2 | 2 | 1,1,1,1,1,1,... |
| 2 | 3 | 1,1,1,1,1,1,... |
| 2 | ... | |

FIG. 6B

| SUPPLY CONDITION NUMBER | DISCHARGE POSITION CORRECTION AMOUNT [μm] | DISCHARGE AMOUNT CORRECTION [pL] |
|---|---|---|
| 1 | 0 | 0 |
| 2 | 1 | 1 |
| 3 | 1 | 2 |
| 4 | 2 | 1 |
| 5 | -1 | 1 |
| ... | | |

FIG. 8A

FIRST SHOT

| SCAN DIRECTION | NOZZLE NUMBER | SUPPLY CONDITION NUMBER |
|---|---|---|
| 1 | 1 | 1,2,1,2,1,2,... |
| 2 | 1 | 1,2,1,2,1,2,... |

| SUPPLY CONDITION NUMBER | DISCHARGE POSITION CORRECTION AMOUNT [μm] | DISCHARGE AMOUNT CORRECTION [pL] |
|---|---|---|
| 1 | 1 | 1 |
| 2 | 1 | 2 |
| 3 | n/a | n/a |

FIG. 8B

SECOND SHOT

| SCAN DIRECTION | NOZZLE NUMBER | SUPPLY CONDITION NUMBER |
|---|---|---|
| 1 | 1 | 1,2,1,2,1,2,... |
| 2 | 1 | 3,2,3,2,3,2,... |

| SUPPLY CONDITION NUMBER | DISCHARGE POSITION CORRECTION AMOUNT [μm] | DISCHARGE AMOUNT CORRECTION [pL] |
|---|---|---|
| 1 | 1 | 1 |
| 2 | 2 | 1 |
| 3 | -1 | 1 |

FIG. 8C

THIRD SHOT

| SCAN DIRECTION | NOZZLE NUMBER | SUPPLY CONDITION NUMBER |
|---|---|---|
| 1 | 1 | 1,2,3,1,2,3,... |
| 2 | 1 | 1,2,3,1,2,3,... |

| SUPPLY CONDITION NUMBER | DISCHARGE POSITION CORRECTION AMOUNT [μm] | DISCHARGE AMOUNT CORRECTION [pL] |
|---|---|---|
| 1 | 2 | 1 |
| 2 | 2 | 2 |
| 3 | 1 | 1 |

FIG. 8D

FOURTH SHOT

| SCAN DIRECTION | NOZZLE NUMBER | SUPPLY CONDITION NUMBER |
|---|---|---|
| 1 | 1 | 1,2,1,2,1,2,... |
| 2 | 1 | 1,2,1,2,1,2,... |

| SUPPLY CONDITION NUMBER | DISCHARGE POSITION CORRECTION AMOUNT [μm] | DISCHARGE AMOUNT CORRECTION [pL] |
|---|---|---|
| 1 | 1 | 1 |
| 2 | 2 | 3 |
| 3 | n/a | n/a |

FIG. 8E

FIFTH SHOT

| SCAN DIRECTION | NOZZLE NUMBER | SUPPLY CONDITION NUMBER |
|---|---|---|
| 1 | 1 | 1,2,1,2,1,2,... |
| 2 | 1 | 3,2,3,2,3,2,... |

| SUPPLY CONDITION NUMBER | DISCHARGE POSITION CORRECTION AMOUNT [μm] | DISCHARGE AMOUNT CORRECTION [pL] |
|---|---|---|
| 1 | 1 | 1 |
| 2 | 2 | 1 |
| 3 | -1 | 1 |

FIG. 9

| SHOT NUMBER | SCAN DIRECTION | NOZZLE | SUPPLY CONDITION NUMBER | DRIVING WAVEFORM NUMBER | |
|---|---|---|---|---|---|
| 1 | 1 | 1 | 1 | 1 | ⎫ S1101 |
| 1 | 1 | 1 | 2 | 2 | |
| 1 | 2 | 1 | 1 | 3 | |
| 1 | 2 | 1 | 2 | 4 | |
| 2 | 1 | 1 | 1 | 1 | |
| 2 | 1 | 1 | 2 | 5 | ⎫ S1102 |
| 2 | 2 | 1 | 2 | 6 | |
| 2 | 2 | 1 | 3 | 1 | |
| 3 | 1 | 1 | 1 | 5 | |
| 3 | 1 | 1 | 2 | 7 | ⎫ S1103 |
| 3 | 1 | 1 | 3 | 1 | |
| 3 | 2 | 1 | 1 | 6 | |
| 3 | 2 | 1 | 2 | 8 | |
| 3 | 2 | 1 | 3 | 2 | |
| 4 | 1 | 1 | 1 | 1 | |
| 4 | 1 | 1 | 2 | 9 | ⎫ S1104 |
| 4 | 2 | 1 | 1 | 3 | |
| 4 | 2 | 1 | 2 | 10 | |
| 5 | 1 | 1 | 1 | 1 | |
| 5 | 1 | 1 | 2 | 5 | |
| 5 | 2 | 1 | 2 | 6 | |
| 5 | 2 | 1 | 3 | 1 | |

F I G. 10

| WAVEFORM STORAGE AREA | 1 | 2 | 3 | 4 | 5 | 6 |
|---|---|---|---|---|---|---|
| BEFORE STARTING SUPPLY STEP OF FIRST SHOT | 1 | 2 | 3 | 4 | n/a | n/a |
| DURING SUPPLY STEP OF FIRST SHOT | 1 | 2 | 3 | 4 | 5(no use) | 6(no use) |
| FIRST SHOT CONTACT TO DURING MOLD SEPARATION STEP | 1 | 2 | 3 | 4 | 5 | 6 |
| DURING SUPPLY STEP OF SECOND SHOT | 1 | 2 | 3 | 4 | 5 | 6 |
| SECOND SHOT CONTACT TO DURING MOLD SEPARATION STEP | 1 | 2 | 7 | 8 | 5 | 6 |
| DURING SUPPLY STEP OF THIRD SHOT | 1 | 2 | 7 | 8 | 5 | 6 |
| THIRD SHOT CONTACT TO DURING MOLD SEPARATION STEP | 1 | 3 | 9 | 10 | 5 | 6 |
| DURING SUPPLY STEP OF FOURTH SHOT | 1 | 3 | 9 | 10 | 5 | 6 |
| FOURTH SHOT CONTACT TO DURING MOLD SEPARATION STEP | 1 | 3 | 9 | 10 | 5(no use) | 6(no use) |
| DURING SUPPLY STEP OF FIFTH SHOT | 1 | 3(no use) | 9(no use) | 10(no use) | 5 | 6 |
| FIFTH SHOT CONTACT TO DURING MOLD SEPARATION STEP | 1 | 3(no use) | 9(no use) | 10(no use) | 5 | 6 |

FIG. 12A

FIRST, THIRD SHOT

| SCAN DIRECTION | NOZZLE NUMBER | SUPPLY CONDITION NUMBER |
|---|---|---|
| 1 | 1 | 1,2,3,1,2,3,... |
| 2 | 1 | 1,2,3,1,2,3,... |

| SUPPLY CONDITION NUMBER | DISCHARGE POSITION CORRECTION AMOUNT [μm] | DISCHARGE AMOUNT CORRECTION [pL] |
|---|---|---|
| 1 | 1 | 1 |
| 2 | 2 | 1 |
| 3 | 3 | 1 |

FIG. 12B

SECOND, FOURTH SHOT

| SCAN DIRECTION | NOZZLE NUMBER | SUPPLY CONDITION NUMBER |
|---|---|---|
| 1 | 1 | 1,2,3,1,2,3,... |
| 2 | 1 | 1,2,3,1,2,3,... |

| SUPPLY CONDITION NUMBER | DISCHARGE POSITION CORRECTION AMOUNT [μm] | DISCHARGE AMOUNT CORRECTION [pL] |
|---|---|---|
| 1 | 4 | 1 |
| 2 | 5 | 1 |
| 3 | 6 | 1 |

FIG. 13A

| WAVEFORM STORAGE AREA | 1 | 2 | 3 | 4 | 5 | 6 |
|---|---|---|---|---|---|---|
| BEFORE STARTING SUPPLY STEP OF FIRST SHOT | 1 | 2 | 3 | 4 | 5 | 6 |
| DURING SUPPLY STEP OF FIRST SHOT | 1 | 2 | 3 | 4 | 5 | 6 |
| FIRST SHOT CONTACT TO DURING MOLD SEPARATION STEP | 7 | 8 | 9 | 10 | 11 | 12 |
| DURING SUPPLY STEP OF SECOND SHOT | 7 | 8 | 9 | 10 | 11 | 12 |
| SECOND SHOT CONTACT TO DURING MOLD SEPARATION STEP | 1 | 2 | 3 | 4 | 5 | 6 |
| DURING SUPPLY STEP OF THIRD SHOT | 1 | 2 | 3 | 4 | 5 | 6 |
| THIRD SHOT CONTACT TO DURING MOLD SEPARATION STEP | 7 | 8 | 9 | 10 | 11 | 12 |
| DURING SUPPLY STEP OF FOURTH SHOT | 7 | 8 | 9 | 10 | 11 | 12 |
| FOURTH SHOT CONTACT TO DURING MOLD SEPARATION STEP | 7 | 8 | 9 | 10 | 11 | 12 |

FIG. 13B

| WAVEFORM STORAGE AREA | 1 | 2 | 3 | 4 | 5 | 6 |
|---|---|---|---|---|---|---|
| BEFORE STARTING SUPPLY STEP OF FIRST SHOT | 1 | 2 | 3 | 4 | 5 | 6 |
| DURING SUPPLY STEP OF FIRST SHOT | 1 | 2 | 3 | 4 | 5 | 6 |
| FIRST SHOT CONTACT TO DURING MOLD SEPARATION STEP | 1 | 2 | 3 | 4 | 5 | 6 |
| DURING SUPPLY STEP OF THIRD SHOT | 1 | 2 | 3 | 4 | 5 | 6 |
| THIRD SHOT CONTACT TO DURING MOLD SEPARATION STEP | 7 | 8 | 9 | 10 | 11 | 12 |
| DURING SUPPLY STEP OF SECOND SHOT | 7 | 8 | 9 | 10 | 11 | 12 |
| SECOND SHOT CONTACT TO DURING MOLD SEPARATION STEP | 7 | 8 | 9 | 10 | 11 | 12 |
| DURING SUPPLY STEP OF FOURTH SHOT | 7 | 8 | 9 | 10 | 11 | 12 |
| FOURTH SHOT CONTACT TO DURING MOLD SEPARATION STEP | 7 | 8 | 9 | 10 | 11 | 12 |

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

In an application of manufacturing a semiconductor device or the like, an imprint apparatus that brings a mold into contact with an imprint material on a substrate and cures the imprint material in this state to form a pattern on a shot region has been put into practical use. The imprint apparatus includes a discharge apparatus that discharges a liquid imprint material. In order to form an article having a fine structure on the order of several nm on a substrate by the imprint apparatus, high accuracy is required for the discharge speed, the discharge amount, and the like of a droplet of the imprint material discharged from a nozzle of the discharge apparatus. If the discharge speed of a droplet of the imprint material is deviated from a target speed, the adhesion position of the droplet on the substrate is deviated. If the discharge amount of the nozzle is deviated from a target discharge amount, the thickness of the discharged imprint material on the substrate may become uneven, and the formed pattern may not have a desired shape.

Therefore, if the discharge speed and the discharge amount are deviated from the target values, it is conceivable to correct a driving waveform to be input to a discharge energy generating element (piezoelectric element) included in the nozzle. For example, Japanese Patent Laid-Open No. 2019-107826 describes that an adjustment table for adjusting a driving signal is provided for each nozzle, and discharge adjustment is performed for each nozzle with reference to the adjustment table.

In order to supply the imprint material in real time without delay, it is required to transfer, at high speed, driving waveform data to a buffer memory in a discharge controller (driver board) of a discharge apparatus (imprint material supply device) every time the imprint is performed. However, since the driving waveform data is required to have a resolution sufficient to effectively perform the correction or adjustment as described above, the driving waveform data has a large data amount and requires a long time to be transferred to the buffer memory. Therefore, the transfer time of the driving waveform data to the buffer memory can be a bottleneck for improving throughput.

SUMMARY OF THE INVENTION

The present invention provides an imprint apparatus advantageous in improving throughput by improving control of data transfer to an imprint material supply device.

The present invention in its one aspect provides an imprint apparatus for performing an imprint process including a supply step of supplying an imprint material onto a shot region of a substrate, a contact step of bringing the imprint material on the shot region into contact with a mold, a curing step of curing the imprint material in a state in which the imprint material is in contact with the mold, and a mold separation step of separating the mold from the cured imprint material, the apparatus comprising a controller configured to control the imprint process, and a supply device configured to supply the imprint material in the supply step, wherein the supply device includes a plurality of discharge devices configured to discharge the imprint material, and a discharge controller configured to control the plurality of discharge devices under the control of the controller, the discharge controller includes a buffer memory configured to temporarily store driving waveform data transferred from the controller, each of the plurality of discharge devices includes a discharge element and a driver configured to drive the discharge element based on the driving waveform data stored in the buffer memory, and while the supply step of a first shot region is performed, the controller performs first transfer processing of transferring the driving waveform data for the supply step of a second shot region to a storage area of the buffer memory which is not used in the supply step of the first shot region.

Further features of the present invention will become apparent from the following description of exemplary embodiments (with reference to the attached drawings).

BRIEF DESCRIPTION OF THE DRAWINGS

FIGS. 1A to 1C are views showing the arrangement of an imprint apparatus;

FIGS. 4A and 4B are graphs showing an example of a driving waveform applied to a discharge element and the surface position of a fluid in the nozzle;

FIG. 5 is a view showing an example of an imprint setting screen;

FIGS. 6A and 6B are tables showing an example of imprint material supply pattern information;

FIGS. 8A to 8E are tables each showing an example of the supply pattern information;

FIG. 9 is a table showing an example of a driving waveform number assignment result;

FIG. 10 is a table showing transition of driving waveform data to be transferred to waveform storage areas of a buffer memory during the imprint process;

FIGS. 12A and 12B are tables each showing an example of supply pattern information;

FIGS. 13A and 13B are tables each showing transition of driving waveform data to be transferred to waveform storage areas of a buffer memory during the imprint process.

DESCRIPTION OF THE EMBODIMENTS

Figure 2:
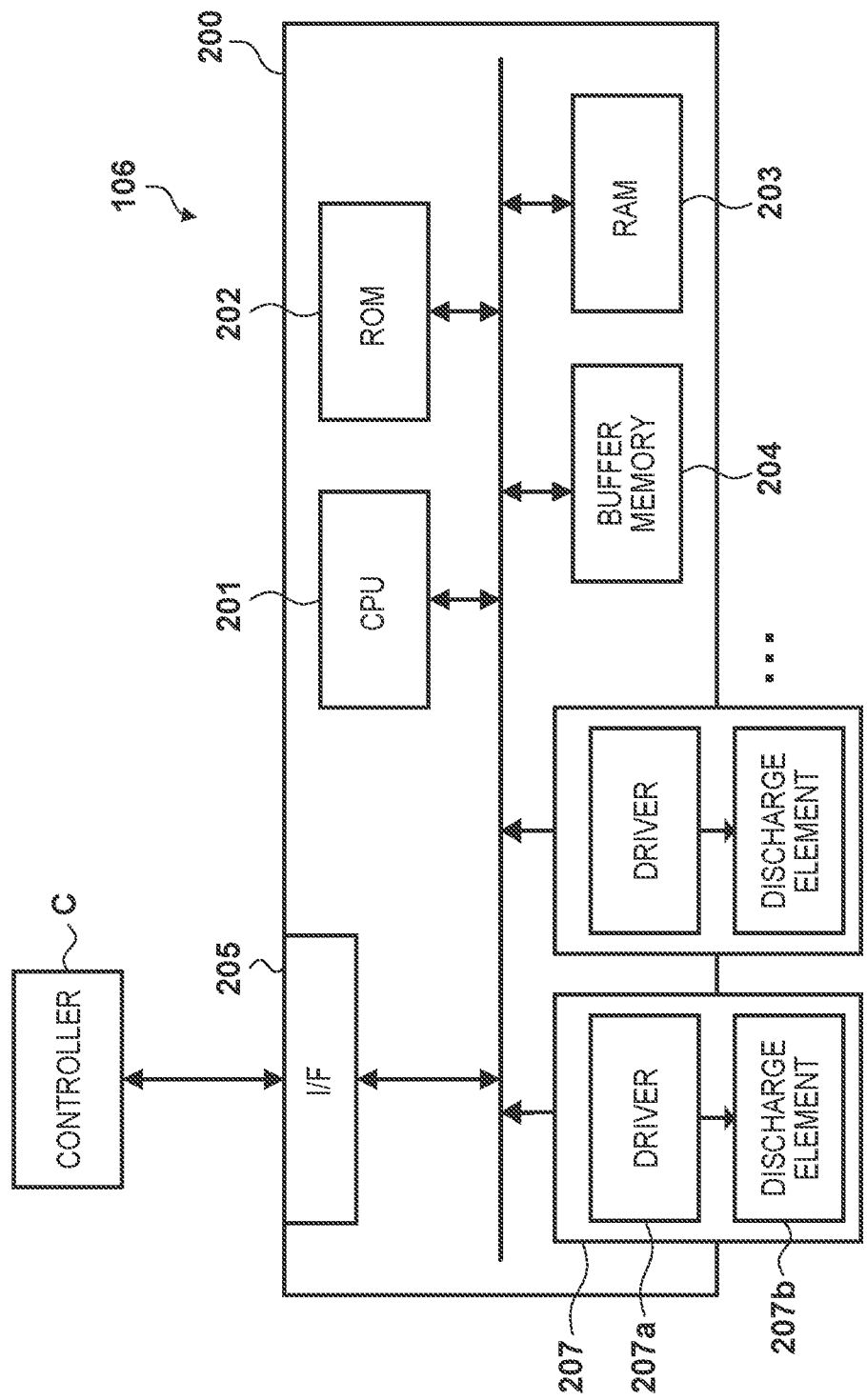
FIG. 2 is a block diagram showing the arrangement of an imprint material supply device.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Firstly, an overview of an imprint apparatus according to an embodiment will be described. The imprint apparatus is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

FIG. 1A shows the arrangement of an imprint apparatus 100 in the embodiment. In the specification and the accompanying drawings, directions will be indicated on an xyz coordinate system in which a horizontal surface is defined as the x-y plane. In general, a substrate 103 serving as an exposure target substrate is placed on a substrate stage 104 such that the surface of the substrate 103 becomes parallel to the horizontal surface (x-y plane). Accordingly, in a following description, directions orthogonal to each other in the plane along the surface of the substrate 103 are defined as the x-axis and the y-axis, and the direction perpendicular to the x- and y axes is defined as the z-axis. Further, in the following description, directions parallel to the x-axis, the y-axis, and the z-axis of the xyz coordinate system are the x direction, the y direction, and the z direction, respectively. A rotation direction about the x-axis, a rotation direction about the y-axis, and a rotation direction about the z-axis are a θx direction, a θy direction, and a θz direction, respectively.

An imprint head 101 holds a mold 102 that includes a concave and convex pattern to be transferred to an imprint material on a substrate. The imprint head 101 includes a mold driving mechanism that drives the mold 102 mainly in the z direction, but the mold driving mechanism may further include a mechanism for driving the mold in other directions (x and y directions) and rotational driving in the θx, θy, and θz directions.

The substrate stage 104 can translate in the x, y, and z directions and rotate in the θx, θy, and θz directions on a stage base 113. A substrate chuck 108 that holds a substrate is provided in the substrate stage 104. The substrate chuck 108 holds the substrate 103 by vacuum-sucking or electrostatic chucking. An imprint material supply device 106 supplies (dispenses) an imprint material onto the substrate 103 held by the substrate stage 104.

A light source 105 generates light including a wavelength capable of curing an imprint material 401. The illuminance of light from the light source 105 can be controlled by the irradiation time and/or the light source voltage. An illuminance detector 123 arranged on the substrate stage 104 detects the illuminance of light emitted by the light source 105. Based on the illuminance detected by the illuminance detector 123, the amount of decrease in illuminance can be measured and the light amount generated by the light source 105 can be adjusted. When the imprint material 401 is a single molecule sequential photoreaction system, the reaction rate of the imprint material 401 with respect to the illuminance is proportional to illuminance×time. When the imprint material 401 is a photo radical polymerization reaction system, the reaction rate of the imprint material 401 with respect to the illuminance is proportional to $\sqrt{\text{illuminance} \times \text{time}}$. The viscoelasticity of the imprint material 401 is set such that it is easily filled into the concave portion of the pattern of the mold 102. By irradiation with light from the light source 105, the photocuring reaction of the imprint material 401 is promoted and its viscoelasticity increases.

A substrate height measurement device 109 includes an optical distance measuring sensor. The height measurement device 109 adjusts the origin to the contact reference surface between the imprint material on the substrate and the mold 102, and measures the height of the transfer target surface of the substrate with respect to the contact reference surface. A mold height measurement device 117 includes an optical distance measuring sensor. The mold height measurement device 117 adjusts the origin to the contact reference surface, and measures the height of the pattern surface of the mold 102 with respect to the contact reference surface.

An on-axis alignment scope 116 is used to measure the relative position between a mark formed on the mold 102 and a mark on the substrate 103 and/or a mark 115 on the substrate stage 104. An off-axis alignment scope 107 is used to measure the relative position between the mark on the substrate 103 and the mark 115 on the substrate stage 104.

An observation camera 114 captures the pattern portion of the mold 102 from the imprint head 101 side. By using the observation camera 114, it is possible to observe the process in which the imprint material 401 on the substrate 103 is filled between the mold 102 and the substrate 103. An image captured by the observation camera 114 may be stored in a storage device such as a memory in a controller C.

The imprint apparatus 100 is accommodated in a clean chamber 118. A gas supply device 120 generates a gas flow 119 inside the imprint apparatus 100 in order to remove heat, dust, and the like generated from the imprint apparatus 100. The gas supply device 120 may be provided in order to generate the gas flow 119 between the imprint material supply device 106 and the substrate 103 or the substrate stage 104. The direction of the gas flow 119 can be set constant so as not to hinder the imprint material discharged from the imprint material supply device 106 from being uniformly discharged onto the substrate 103. FIG. 1A describes that the gas flow 119 flows in the x direction, but it may be configured such that the gas flow 119 flows in they direction. The gas supply device 120 can include a chemical filter and a particle filter. The gas supply device 120 can draw in air in an atmosphere where the clean chamber 118 is installed, and remove chemical substances and dust slightly contained in the drawn air by the chemical filter and the particle filter. Thus, clean air is supplied from an air blowing port (not shown) to a space inside the clean chamber 118. A gas collecting device 121 recovers the gas in the clean chamber 118. A vacuum pump can be used as the gas collecting device 121.

FIG. 1B shows the arrangement of the imprint head 101. The imprint head 101 includes a mold holding device 110 that holds the mold 102. A closed space formed between a seal glass 112 and the back surface of the mold 102 is connected to a pressure control apparatus (not shown) via a pipe 111 so that the pressure in the closed space can be increased and decreased. By making the pressure in the closed space higher than the pressure (atmospheric pressure) in the imprint apparatus by the pressure control apparatus, the mold 102 can be deformed into a convex shape toward the substrate. A replacing gas supply device 125 supplies a replacing gas into a space between the mold 102 and the substrate 103. With this, the air in the space is replaced with the replacing gas. For example, the replacing gas can be helium. By filling helium, the fillability during a contact step is improved by the helium coming out from the mold 102, and occurrence of curing failure of the imprint material 401 due to oxygen inhibition during a curing step can be suppressed. The supply amount of the replacing gas is determined by, for example, a test using a plurality of combinations each having the gap amount between the pattern portion of the mold 102 and the substrate 103 and the supply amount of the replacing gas.

The controller C manages execution of an imprint process by comprehensively controlling respective units of the imprint apparatus 100. The controller C can be implemented by a computer apparatus. FIG. 1C is a block diagram showing the arrangement of the controller C. The controller C can include a CPU 151, a RAM 152 that stores temporal data and provides a work area to the CPU 151, and a ROM 153 storing permanent data and programs. The controller C can further include a hard disk drive (HDD) 154, a display device 155, and an interface 156. The HDD 154 stores a control program 154a for executing an imprint process, and driving waveform data (to be described later) to be provided to the imprint material supply device 106. The display device 155 displays various kinds of information. The interface 156 is an interface for connection with the respective units (including the imprint material supply device 106) of the imprint apparatus 100. The controller C may be accommodated in the clean chamber 118, or may be installed outside the clean chamber 118.

The general arrangement of the imprint apparatus 100 in this embodiment has been described above. Next, an imprint process executed by the imprint apparatus 100 will be described.

The imprint process can include a supply step of supplying an imprint material onto the substrate 103, a contact step of bringing the imprint material on the substrate 103 into contact with the mold 102, a curing step of curing the imprint material, and a mold separation step of separating the imprint material from the mold 102. A specific operation example is as follows. This operation is performed by the controller C executing the control program.

In the supply step, while the substrate stage 104 is scan-driven in the X direction or the Y direction below the imprint material supply device 106, the imprint material is supplied from the imprint material supply device 106. With this operation, the imprint material is supplied (arranged) to a shot region (imprint region) on the substrate 103. In this embodiment, the imprint material is collectively supplied to a plurality of shot regions adjacent to each other on the substrate 1.

Next, in the contact step, the substrate stage 104 is moved immediately below the imprint head 101. If the shot region reaches immediately below the imprint head 101, the substrate stage 104 is stopped. Then, the imprint head 101 lowers the mold 102 to start bringing the mold 102 into contact with the imprint material on the substrate 103. By bringing the mold 102 into contact with the imprint material on the substrate 103, the imprint material is filled into the pattern portion of the mold 102.

Next, in the curing step, the shot region is irradiated with light (ultraviolet light) from the light source 105 to cure the imprint material. Then, in the mold separation step, the imprint head 101 lifts the mold 102 to separate the mold 102 from the cured imprint material. This series of operations is called the imprint process. The imprint process is repeated for the plurality of shot regions on the substrate. If all the shot regions have undergone the imprint process, the substrate 103 is unloaded to the outside of the imprint apparatus 100.

Alternatively, the supply step may be continuously performed in advance for the plurality of shot regions adjacent to each other or all the shot regions on the substrate (multi-area advance supply), and then the contact step, the curing step, and the mold separation step may be performed for each shot region. After the mold separation step is completed, the substrate stage 104 drives so as to arrange a next shot region immediately below the imprint head 101.

FIG. 2 shows an arrangement example of the imprint material supply device 106. The imprint material supply device 106 is configured as a dispenser including a nozzle that discharges an imprint material (a resin in an uncured state) onto a substrate. The imprint material supply device 106 employs, for example, a piezo jet method, a micro solenoid method, or the like, and can supply an imprint material of a small volume such as 1 pL (pico liter) onto a substrate. Note that the number of nozzles included in the imprint material supply device 106 is not limited. The imprint material supply device 106 may include one nozzle (single nozzle), or may include many nozzles over one hundred.

In FIG. 2, the imprint material supply device 106 includes a plurality of nozzles 207 serving as a plurality of discharge devices, and a discharge controller 200 that controls the plurality of nozzles 207 under the control of the controller C. Each of the plurality of nozzles 207 can include a discharge element 207b including a piezoelectric element (discharge energy generating element), and a driver 207a that drives the discharge element 207b. The discharge controller 200 can be configured as a driver board that controls the driver 207a.

The discharge controller 200 can include a CPU 201 serving as a processing device, a ROM 202, and a RAM 203. The discharge controller 200 is connected to the controller C via an interface 205. The discharge controller 200 further includes a buffer memory 204 that temporarily stores driving waveform data received from the controller C. Storage areas for storing a plurality of driving waveform data for each discharge device (each nozzle) are ensured in the buffer memory 204. Each of the plurality of driving waveform data can be identified by a driving waveform number. The driving waveform data to be used is determined by a supply condition. The CPU 201 supplies the driving waveform data stored in the buffer memory 204 to the driver 207a. The driver 207a drives the discharge element 207b based on the supplied driving waveform data.

Figure 3A:
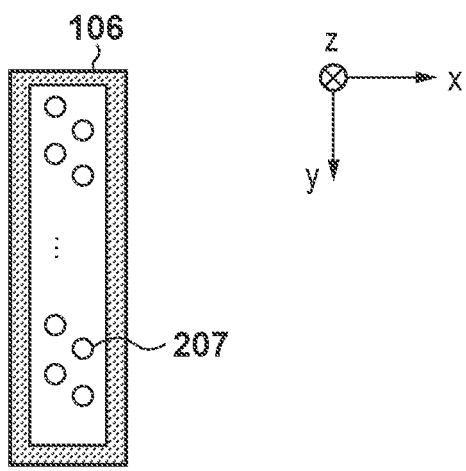
FIGS. 3A to 3D are views for explaining a process of discharging a droplet from a nozzle.

FIG. 3A shows a view of the discharge port surface of the imprint material supply device 106 when viewed from below. Discharge ports of the plurality of nozzles 207 are formed in the discharge port surface. The discharge ports of the plurality of nozzles 207 are arrayed in one or a plurality of lines in the x direction and a plurality of lines in the y direction. The number of discharge ports arranged in the y direction can be several thousands in some apparatuses. The arrangement interval of the plurality of discharge ports can be several µm to several ten µm. The smaller the arrangement interval of the plurality of discharge ports, the shorter the time required to fill the imprint material into the concave pattern of the mold 102 can be. However, if the arrangement interval is too small, it is difficult to manufacture the discharge head, and droplets of the imprint material discharged from adjacent discharge ports can interfere with each other. If adjacent droplets interfere with each other, they may fuse with each other and the position of the droplet may be deviated from a target position. In order to prevent such interference, as shown in FIG. 3A, the adjacent discharge port lines can be arrayed so as to be shifted from each other.

Figure 3B:
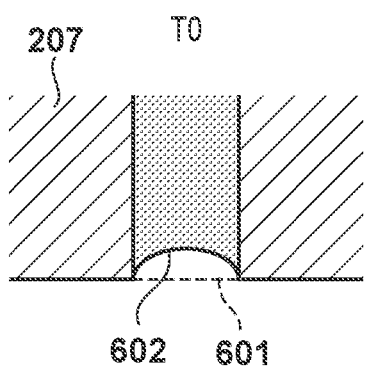
Figure 3C:
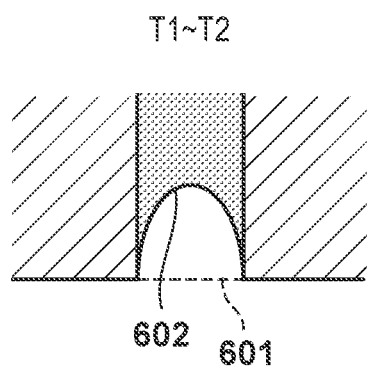
Figure 3D:
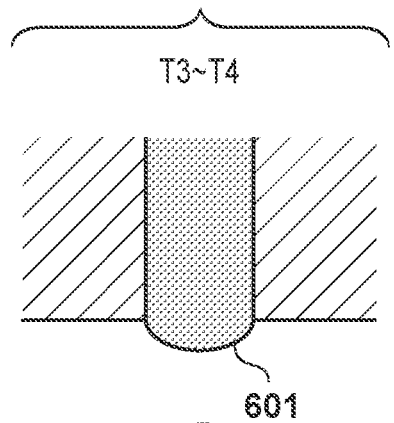

Each of FIGS. 3B to 3D shows the X-Z cross section of the nozzle 207 of the imprint material supply device 106. FIG. 3B shows a state before the discharge element 207b (piezoelectric element) in the nozzle 207 is driven. At this time, a liquid surface 602 representing the interface between the imprint material and the outside air can be in a state in which the liquid surface 602 is slightly pulled upward from a discharge port surface 601. FIG. 3C shows a state in which the imprint material is pulled upward from the discharge port surface 601 by driving of the piezoelectric element. FIG. 3D shows a state immediately after a droplet 603 is discharged from the nozzle 207 by driving of the discharge element 207b.

FIG. 4A shows an example of the waveform of a driving signal 720 applied to the discharge element 207b. The driving signal 720 is a voltage signal applied to the discharge element 207b to discharge the imprint material in the nozzle 207 as the droplet 603. The abscissa represents the time, and the ordinate represents the voltage. The basic waveform of the driving signal 720 is a trapezoidal wave as shown in FIG. 4A. The driving signal 720 of the trapezoidal wave is formed by five components of a pulling component 701, a first standby component 702, a pushing component 703, a second standby component 704 that returns the voltage value to the start value, and a returning component 705.

The respective components of the driving signal 720 correspond to time regions obtained by dividing the time from T0 to T5 into five regions. The driving waveform in the section from T0 to T1 serves as the pulling component 701, the driving waveform in the section from T1 to T2 serves as the first standby component 702, and the driving waveform in the section from T2 to T3 serves as the pushing component 703. Further, the driving waveform in the section from T3 to T4 serves as the second standby component 704, and the driving waveform in the section from T4 to T5 serves as the returning component 705.

FIG. 4B is a graph showing the z-direction position of the liquid surface 602 of the imprint material in the nozzle 207 generated by applying the driving signal 720 shown in FIG. 4A to the discharge element 207b. In the initial state before the discharge element 207b included in the nozzle 207 is driven as shown in FIG. 3B, the liquid surface 602 is located at a reference position 706. Then, if the discharge element 207b is driven, the liquid surface 602 is pulled in the +z direction and reaches a pulled position 707, and then pushed to a pushed position 708 in the −z direction. While being pushed to the pushed position 708, the droplet 603 is formed. Accordingly, the actual position of the liquid surface is located on the −z direction side of the position shown in FIG. 4B. However, for the sake of descriptive convenience, FIG. 4B shows not the position where the droplet 603 is formed but a representative position of the liquid surface 602. The section from T5 to T6 shows the time until the liquid surface 602 of the imprint material 401 in the nozzle 207 returns to the position (the reference position 706 in FIG. 4B) in the initial state after the droplet 603 is discharged from the nozzle 207. Note that strictly speaking, the liquid surface 602 moves after the time of applying the voltage to the discharge element 207b, but such a delay component is omitted in FIG. 4B.

FIG. 5 shows an example of an imprint setting screen (setting unit) displayed on the display device 155 of the controller C. In an imprint order display portion 501, the imprint order is displayed on each of a plurality of shot regions displayed based on shot layout information of the substrate. Note that in the example shown in FIG. 5, the identification number (shot number) of the shot region (to be also simply referred to as "shot" hereinafter) matches the number indicating the imprint order. A supply group display portion 502 displays the number of a shot region group to which the imprint material is collectively supplied when multi-area advance supply is performed. Note that in the example shown in FIG. 5, no multi-area advance supply group is set (that is, one group includes one shot region), so that the group number matches the imprint order displayed in the imprint order display portion 501. In a shot information input portion 503, the correspondence relationship among the shot number, the imprint order, the imprint material supply pattern name (identification information of the supply pattern information), and the imprint material supply group number is displayed. Among them, the contents of the imprint order, the imprint material supply pattern name, and the imprint material supply group number can be changed by a user operation.

FIGS. 6A and 6B are tables showing an example of the imprint material supply pattern information. The supply pattern includes a scan direction at the time of supply, the nozzle number for specifying the nozzle, and the supply condition number at each discharge timing. As for the scan direction, the forward scan is indicated by "1" and the backward scan is indicated by "2". Supply condition number 0 indicates that no discharge is performed at this timing. The contents of correction corresponding to each supply condition number are shown in FIG. 6B. FIG. 6B defines the discharge position correction amount and the discharge amount correction amount corresponding to each supply condition number. Both the discharge position correction amount and the discharge amount correction amount corresponding to supply condition number 1 are 0, and this indicates that the imprint material is supplied in a reference discharge amount onto a reference position on a grid. The discharge amount correction amount is set as a relative correction amount from the reference discharge amount. The driving waveform is determined based on the discharge position correction amount and the discharge amount correction amount.

Figure 7:
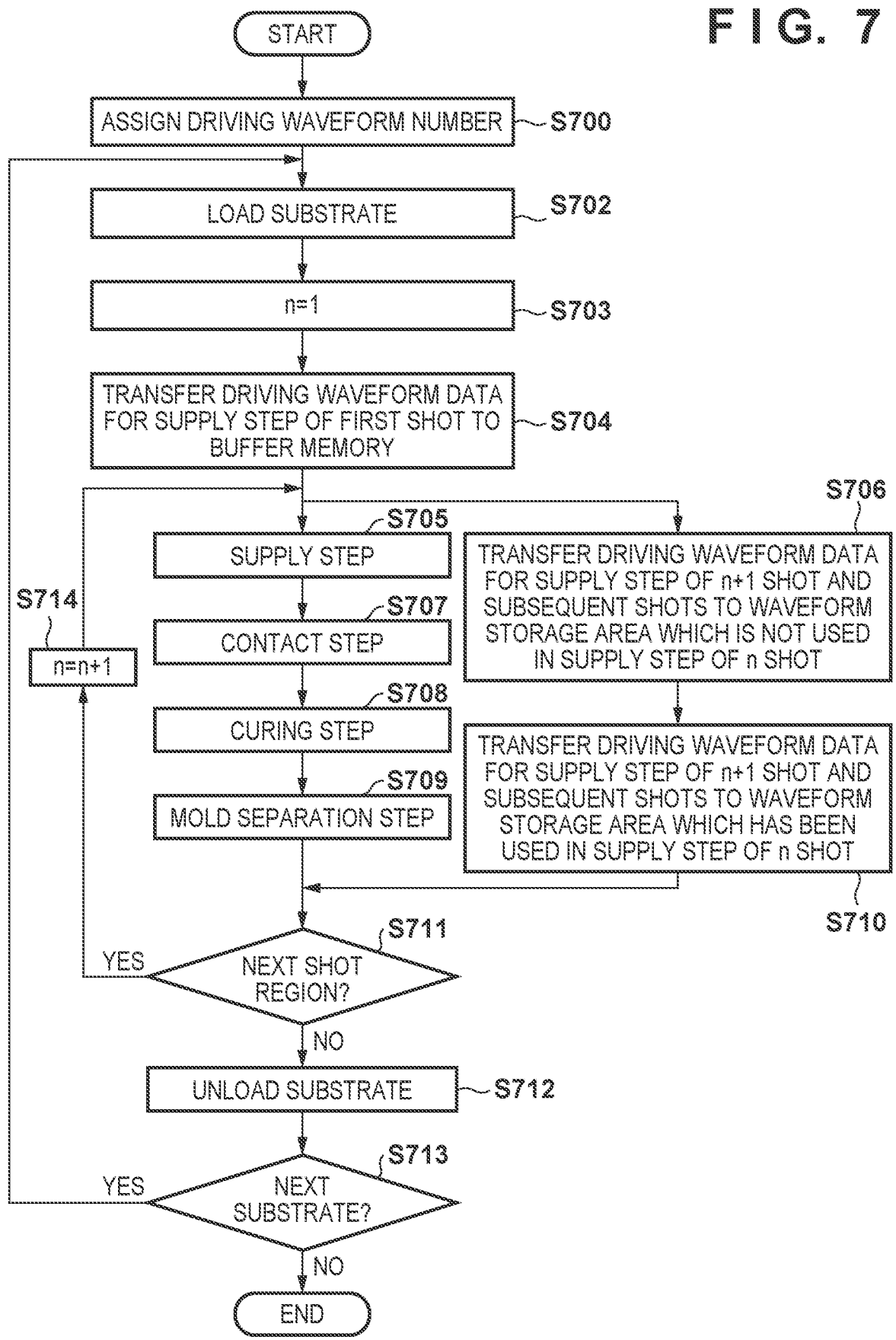
FIG. 7 is a flowchart illustrating an imprint process.

FIG. 7 is a flowchart of the imprint process in this embodiment. This process is executed by the controller C. More specifically, the program corresponding to this flowchart is included in, for example, the control program 154a in the controller C, and loaded to the RAM 152 to be executed by the CPU 151. Note that in this flowchart, the substrate 103 is formed by five shot regions, and the imprint order is set in the order of the shot number, that is, in the order of the first shot, the second shot, the third shot, the fourth shot, and the fifth shot. Further, in this flowchart, no supply group is set (that is, no multi-area advance supply is performed), and the supply step, the contact step, the curing step, and the mold separation step are performed for each shot. Furthermore, in the buffer memory 204 of the discharge control device 200, storage areas (waveform storage areas) capable of storing six driving waveform data for each nozzle are ensured.

In step S700, based on the supply pattern information of the first to fifth shots as shown in FIGS. 8A to 8E, the controller C assigns the driving waveform number corresponding to each shot region, each scan direction, and the supply condition (discharge condition) for each nozzle (discharge position correction amount and discharge amount correction amount). FIG. 9 shows an example of the driving waveform number assignment result obtained in step S700. In FIG. 9, first, the first shot includes two types of scan directions, that is, the forward scan 1 and the backward scan 2, and two types of supply condition numbers 1 and 2. Therefore, driving waveform numbers 1 to 4 are newly assigned to a total of four types of driving waveforms (step S1101).

Next, for the second shot, the driving waveform corresponding to a combination of the forward scan 1 in the scan direction and supply condition number 2 is newly assigned with driving waveform number 5 (step S1102). Further, the driving waveform corresponding to a combination of the backward scan 2 in the scan direction and supply condition number 2 is newly assigned with driving waveform number 6. In the second shot, since the driving waveform corresponding to a combination of the forward scan 1 in the scan direction and supply condition number 1 is equal to the driving waveform with the forward direction 1 in the scan direction and supply condition number 1 in the first shot, no new driving waveform number is assigned thereto. For the combination of the forward scan 1 in the scan direction and supply condition number 1, the discharge position correction amount is +1 µm, so that the driving waveform is corrected so as to decrease the discharge speed. On the other hand, in the second shot, for a combination of the backward scan 2 in the scan direction and supply condition number 3, the discharge position correction amount is −1 µm, so that the driving waveform is corrected so as to decrease the discharge speed. As a result, in the second shot, the driving waveform corresponding to the combination of the backward scan 2 in the scan direction and supply condition number 3 is equal to the driving waveform with the forward scan 1 in the scan direction and supply condition number 1 in the second shot, so no new driving waveform number is assigned thereto.

Similarly, in the third shot, the driving waveform corresponding to a combination of the forward scan 1 in the scan direction and supply condition number 2 is newly assigned with driving waveform number 7 (step S1103). Further, the driving waveform corresponding to a combination of the backward scan 2 in the scan direction and supply condition number 2 is newly assigned with driving waveform number 8. Furthermore, in the fourth shot, the driving waveform corresponding to a combination of the forward scan 1 in the scan direction and supply condition number 2 is newly assigned with driving waveform number 9 (step S1104). The driving waveform corresponding to a combination of the backward scan 2 in the scan direction and supply condition number 2 is newly assigned with driving waveform number 10. For the fifth shot, the supply pattern information and the driving waveforms to be used are same as those in the second shot, so no new driving waveform number is assigned.

In step S702, an imprint target substrate is loaded. More specifically, the controller C controls a substrate conveyance mechanism (not shown) to convey the imprint target substrate into the imprint apparatus 100 and place it on the substrate stage 104. In step S703, the controller C initializes a variable n representing the shot number according to the imprint order to 1. In step S704, the controller C transfers the driving waveform data for the supply step of the first shot region (the driving waveform data corresponding to the driving waveform number assigned in step S701) to the buffer memory 204 of the discharge controller 200.

Thereafter, the supply step of the nth shot (first shot region) is performed in step S705. In step S706, while the supply step is performed in step S705, the controller C transfers the driving waveform data for the supply step of the (n+1)th shot (second shot region) to the storage area of the buffer memory 204 which is not used in the supply step of the nth shot (first transfer processing). Here, the driving waveform data for the supply step of the (n+1)th shot is the driving waveform data corresponding to the driving waveform number of the (n+1)th shot assigned in step S700. Note that if the multi-area advance supply is set, the driving waveform data for the multi-area advance supply of the (n+1)th and subsequent shots are transferred.

In step S707, the contact step of the nth shot is performed using the driving waveform data for the supply step of the nth shot stored in the buffer memory 204. Then, the curing step is performed in step S708, and the mold separation step is performed in step S709. In step S706, not all the driving waveform data for the supply step of the (n+1)th shot may be transferred due to lack of a free storage area in the buffer memory 204. If such untransferred driving waveform data arises, the controller C transfers, in step S710, the untransferred driving waveform data of the (n+1)th shot to the storage area of the buffer memory 204 which has been used in the supply step of the nth shot (second transfer processing). Note that if the multi-area advance supply is set, the driving waveform data for the multi-area advance supply of the (n+1)th and subsequent shots are transferred. Step S710 is performed after the supply step is completed and before the contact step, the curing step, and the mold separation step in steps S707 to S709 are completed. The controller C can determine whether untransferred driving waveform data has arisen in the first transfer processing based on the storage capacity of the waveform storage area of the buffer memory 204 which is not used in the supply step of the nth shot and the data amount of the driving waveform data. Thereafter, the controller C may perform the second transfer processing if it is determined that untransferred driving waveform data has arisen.

In step S711, the controller C determines whether the imprint process is completed for all the shots. If there is an unprocessed shot, the controller C increments the variable n by 1 in step S714, and the process is returned to step S705 and repeated. If the imprint process is completed for all the shots, the substrate is unloaded in step S712. More specifically, the controller C releases the holding state of the substrate placed on the substrate stage 104, and controls the substrate conveyance mechanism to unload the substrate to the outside of the imprint apparatus 100. In step S713, the controller C determines whether there is a next substrate to be processed. If there is a next substrate to be processed, the process is returned to step S702 and repeated on the next substrate. If assignment of the driving waveform number is adjusted for each substrate, the process may be returned to step S700 for each substrate or as needed. If the process is completed for all the planed substrates, this process is terminated.

FIG. 10 shows transition of the driving waveform data to be transferred to the waveform storage areas of the buffer memory 204 during the imprint process on the first to fifth shots. First, before starting the supply step of the first shot (step S705), the driving waveform data corresponding to driving waveform numbers 1 to 4 (see FIG. 9) for the supply step of the first shot are transferred to waveform storage areas 1 to 4, respectively (step S704). As shown in FIG. 10, while the supply step of the first shot is performed, waveform storage areas 5 and 6 are not used. Therefore, while the supply step of the first shot is performed, the driving waveform data corresponding to driving waveform numbers 5 and 6 to be used in the supply step of the second shot are transferred to the waveform storage areas 5 and 6, respectively (step S706). Since all of the waveform storage areas 1 to 6 are used in the supply step of the second shot, the waveform storage areas are not updated until the supply step of the second shot is completed.

Next, while the contact step, the curing step, and the mold separation step (steps S707 to S709) of the second shot are performed, the driving waveform data corresponding to driving waveform numbers 7 and 8 to be used in the supply step of the third shot are transferred to the buffer memory 204 (step S710). Here, since the driving waveform data corresponding to driving waveform numbers 1, 2, 5, and 6 have also been used in the second shot, they remain in the storage areas, and the driving waveform data corresponding to driving waveform numbers 7 and 8 are transferred to the waveform storage areas 3 and 4 storing the driving waveform data corresponding to driving waveform numbers 3 and 4, respectively. Then, since all of the waveform storage areas 1 to 6 are used in the supply step of the third shot, the waveform storage areas are not updated until the supply step of the third shot is completed.

Next, while the contact step, the curing step, and the mold separation step (steps S707 to S709) of the third shot are performed, the driving waveform data corresponding to driving waveform numbers 3, 9, and 10 to be used in the supply step of the fourth shot are transferred to the buffer memory 204 (step S710). Here, since the driving waveform data corresponding to driving waveform number 1 has been also used in the third shot, it remains in the waveform storage area, and the driving waveform data for the fourth shot is transferred to the waveform storage areas 2 to 6 storing the driving waveform data other than the driving waveform data corresponding to driving waveform number 1. Here, since the driving waveform data corresponding to driving waveform numbers 5 and 6 set in the waveform storage areas 5 and 6 are also used in the fifth shot, it is desirable that they are held in the waveform storage areas. Accordingly, the driving waveform data corresponding to driving waveform numbers 3, 9, and 10 are transferred to the waveform storage areas 2 to 4, respectively.

The driving waveform data to be used in the supply step of the fifth shot are held in the waveform storage areas 1, 5, and 6, respectively, during the supply step of the fourth shot. Therefore, the waveform storage areas 1 to 6 during the supply step of the fourth shot are maintained until the supply step of the fifth shot is completed.

Second Embodiment

Figure 11:
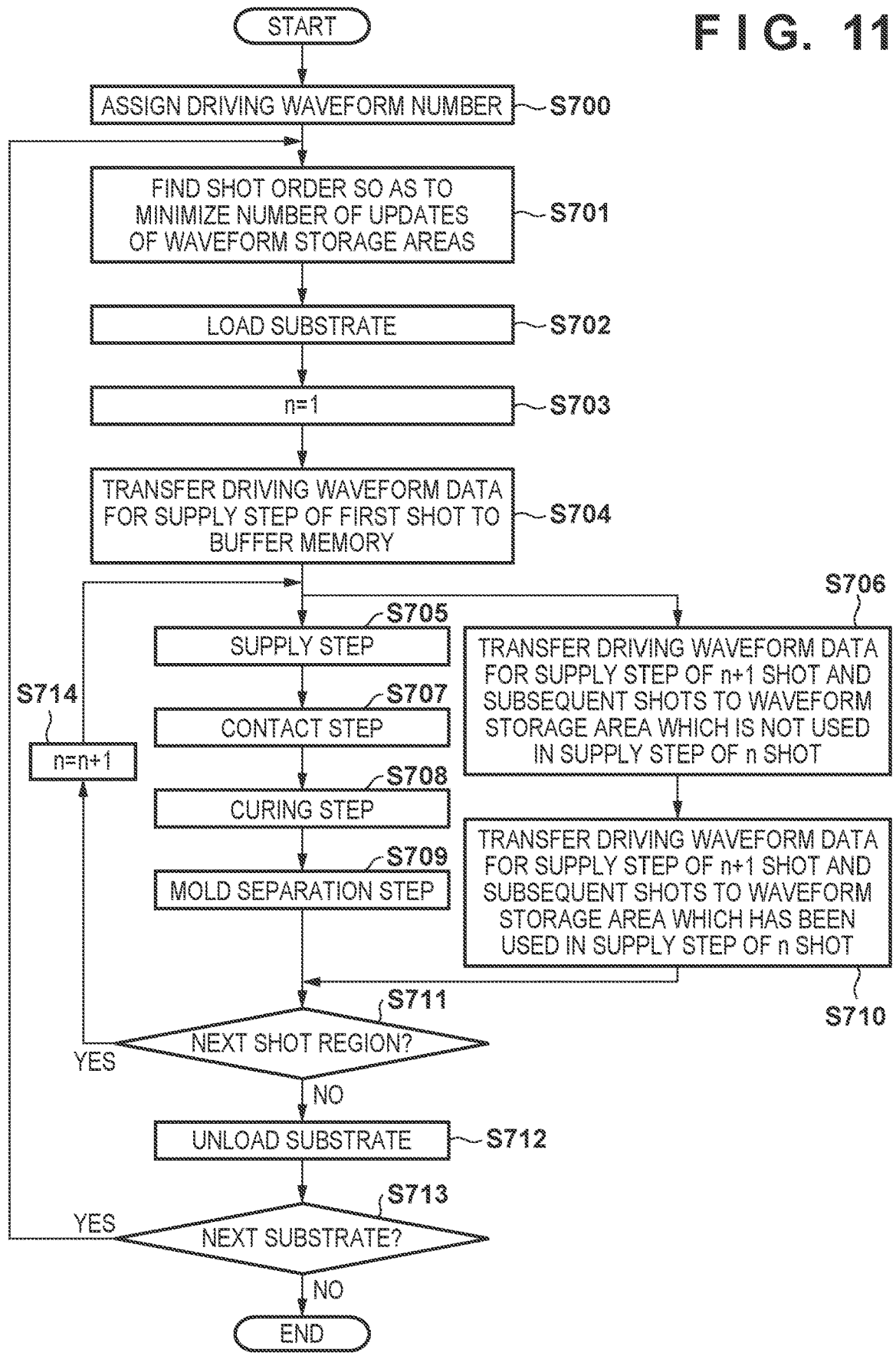
FIG. 11 is a flowchart illustrating another imprint process.

FIG. 11 is a flowchart of an imprint process in the second embodiment. In this embodiment, there are four shots in a substrate, in which supply pattern information as shown in FIG. 12A is set in each of the first shot and the third shot, and supply pattern information as shown in FIG. 12B is set in each of the second shot and the fourth shot. Further, in this embodiment, waveform storage areas capable of storing six driving waveform data for one nozzle are ensured in a buffer memory 204. A difference between the flowchart of FIG. 11 and the flowchart of FIG. 7 is that step S701 is added to the flowchart of FIG. 11. Steps other than step S701 are similar to those in the flowchart of FIG. 7, so that a description thereof will be omitted. In this embodiment, 12 driving waveforms are used in the substrate, and driving waveform numbers 1 to 12 are assigned in step S700. In step S701, the shot order (imprint order) is determined so as to minimize the number of updates of the waveform storage areas of the buffer memory 204. Step S701 will be described below in detail.

FIG. 13A shows an example of transition of driving waveform data to be transferred to the waveform storage areas of the buffer memory 204 when the imprint process (supply, contact, curing, and mold separation) is performed in the order of the first shot, the second shot, the third shot, and the fourth shot. In FIG. 13A, the waveform storage areas are updated at three timings, that is, during the contact step of the first shot, during the contact step of the second shot, and during the contact step of the third shot. If the update processing takes a long time, the productivity decreases accordingly.

In step S701, for each nozzle, a controller C classifies the plurality of shots of the substrate into shot groups each formed by shots having common driving waveform data to be used. The cost of switching one driving waveform data between the shot groups is defined to be 1, and the controller C determines the processing order of the shot groups so as to minimize the total sum of the costs. This results in the traveling salesman problem, and the solution may be found by a local search method or the like without finding an exact solution in consideration of the calculation cost.

FIG. 13B shows transition of the driving waveform data to be transferred to the waveform storage areas of the buffer memory 204 after being sorted in the determined shot order. Here, the determined shot order is the order of the first shot, the third shot, the second shot, and the fourth shot. In FIG. 13B, the waveform storage areas 1 to 6 are updated only during the contact step of the third shot. This example is more advantageous in terms of throughput than the example shown in FIG. 13A in which the waveform storage areas are updated at three timings, that is, during the contact step of the first shot, during the contact step of the second shot, and during the contact step of the third shot.

<Embodiments of an Article Manufacturing Method>

The pattern of the cured product formed using the imprint apparatus is used permanently on at least a part of the various articles or temporarily in manufacturing the various articles. The article may be an electric circuit element, an optical element, a MEMS, a recording element, a sensor, a mold, or the like. Examples of the electric circuit element include a volatile or nonvolatile semiconductor memory such as a DRAM, SRAM, a flash memory, and a MRAM, and semiconductor elements such as LSIs, CCDs, image sensors, and FPGA. The mold may be an imprint mold or the like.

The pattern of the cured product may be used as it is as a constituent member of at least a part of the aforementioned article, or may be temporarily used as a resist mask. After etching, ion implantation, or the like is performed in the substrate processing step, the resist mask is removed.

Next, the article manufacturing method will be described. In step SA of FIG. 14, a substrate 1z such as a silicon substrate having a surface on which a processed material 2z such as an insulator is formed is prepared, and subsequently, an imprint material 3z is applied to the surface of the processed material 2z by an ink-jet method or the like. Here, an imprint material 3z in the form of a plurality of droplets is applied onto a substrate.

Figure 14:
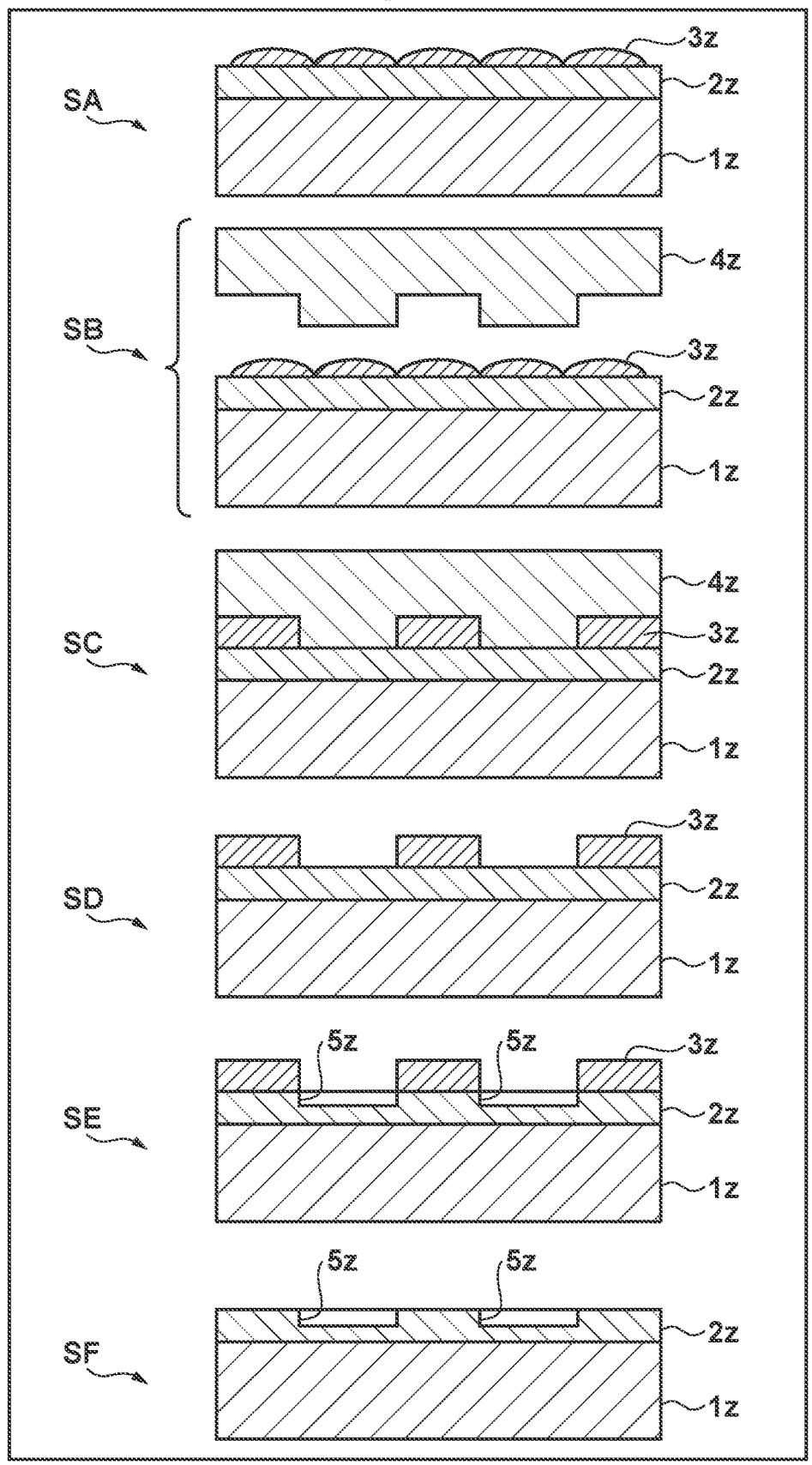
FIG. 14 is a view for explaining an article manufacturing method.

In step SB of FIG. 14, the side of the mold 4z for imprinting on which the concavo-convex pattern is formed is opposite the imprint material 3z on the substrate. In step SC of FIG. 14, the substrate 1z to which the imprint material 3z has been applied and the mold 4z are brought into contact, and the pressure is applied. The imprint material 3z fills the gaps between the mold 4z and the processed material 2z. In this state, when light is irradiated as curing energy through the mold 4z, the imprint material 3z is cured.

In step SD of FIG. 14, when the mold 4z and the substrate 1z are separated after curing the imprint material 3z, patterns of a cured product of the imprint material 3z are formed on the substrate 1z. In the pattern of the cured product, the concave portion of the mold corresponds to the convex portion of the cured product, and the convex portion of the mold corresponds to the concave portion of the cured product, that is, the concave-convex pattern of the mold 4z is transferred onto the imprint material 3z.

In the step SE of FIG. 14, when etching is performed using the cured product pattern as an etching resistant mask, portions of the surfaces of the processed material 2z where there is no cured product or that remain thin are removed, resulting in a trench 5z. In step SF of FIG. 14, when the patterns of the cured product are removed, an article in which the trench 5z is formed on the surface of the processed material 2z can be obtained. Although the pattern of the cured product is removed here, it may be used as a film for interlayer insulation included in a semiconductor element or the like, that is, a constituent member of an article, for example, without being removed even after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-080690, filed Apr. 30, 2020, which is hereby incorporated by reference herein in its entirety.

What is claimed is:

1. An imprint apparatus for performing an imprint process including a supply step of supplying an imprint material onto a shot region of a substrate, a contact step of bringing the imprint material on the shot region into contact with a mold, a curing step of curing the imprint material in a state in which the imprint material is in contact with the mold, and a mold separation step of separating the mold from the cured imprint material, the apparatus comprising:
   a controller configured to control the imprint process; and
   a supply device configured to supply the imprint material in the supply step,
   wherein the supply device includes a plurality of discharge devices configured to discharge the imprint material, and a discharge controller configured to control the plurality of discharge devices under the control of the controller,
   wherein the discharge controller includes a buffer memory configured to temporarily store driving waveform data transferred from the controller,
   wherein each of the plurality of discharge devices includes a discharge element and a driver configured to drive the discharge element based on the driving waveform data stored in the buffer memory,
   wherein, while the supply step of a first shot region is performed, the controller is configured to perform first transfer processing of transferring the driving waveform data for the supply step of a second shot region to a storage area of the buffer memory which is not used in the supply step of the first shot region, and
   wherein, after the supply step of the first shot region is completed and before the contact step, the curing step, and the mold separation step of the first shot region are completed, the controller is configured to perform second transfer processing of transferring the driving waveform data for the supply step of the second shot region to the storage area of the buffer memory which has been used in the supply step of the first shot region.

2. The apparatus according to claim 1,
   wherein, if untransferred driving waveform data is generated in the first transfer processing due to a lack of a free storage area in the buffer memory, the controller is configured to transfer the untransferred driving waveform data in the second transfer processing.

3. The apparatus according to claim 1,
   wherein the second shot region is a shot region on which the imprint process is executed next to the first shot region.

4. The apparatus according to claim 1,
   wherein the controller is configured to assign, based on imprint material supply pattern information for each shot region, a driving waveform number corresponding to an imprint material discharge condition for each discharge device for each shot region, and transfer the driving waveform data corresponding to the assigned driving waveform number to the buffer memory in the first transfer processing.

5. The apparatus according to claim 4, further comprising a substrate stage configured to hold and move the substrate,
wherein the controller is configured to control the substrate stage and the supply device such that the supply device discharges the imprint material while the substrate stage is scan-driven below the supply device to supply the imprint material onto the shot region, and
wherein the controller is configured to assign the driving waveform number corresponding to the imprint material discharge condition for each scan direction in the scan-driving, each shot region, and each discharge device.

6. The apparatus according to claim 4, further comprising a setting unit configured to set an imprint order of the plurality of shot regions of the substrate and identification information of the supply pattern information via a user operation.

7. The apparatus according to claim 1,
wherein the controller is configured to determine an imprint order so as to minimize the number of updates of the storage area of the buffer memory.

8. An article manufacturing method comprising:
forming a pattern on a substrate using an imprint apparatus that performs an imprint process including a supply step of supplying an imprint material onto a shot region of a substrate, a contact step of bringing the imprint material on the shot region into contact with a mold, a curing step of curing the imprint material in a state in which the imprint material is in contact with the mold, and a mold separation step of separating the mold from the cured imprint material, the apparatus comprising:
a controller configured to control the imprint process; and
a supply device configured to supply the imprint material in the supply step,
wherein the supply device includes a plurality of discharge devices configured to discharge the imprint material, and a discharge controller configured to control the plurality of discharge devices under the control of the controller,
wherein the discharge controller includes a buffer memory configured to temporarily store driving waveform data transferred from the controller,
wherein each of the plurality of discharge devices includes a discharge element and a driver configured to drive the discharge element based on the driving waveform data stored in the buffer memory,
wherein, while the supply step of a first shot region is performed, the controller is configured to perform first transfer processing of transferring the driving waveform data for the supply step of a second shot region to a storage area of the buffer memory which is not used in the supply step of the first shot region, and
wherein, after the supply step of the first shot region is completed and before the contact step, the curing step, and the mold separation step of the first shot region are completed, the controller is configured to perform second transfer processing of transferring the driving waveform data for the supply step of the second shot region to the storage area of the buffer memory which has been used in the supply step of the first shot region; and
processing the substrate on which the pattern has been formed in the forming,
wherein an article is manufactured from the substrate having undergone the processing.

* * * * *